(12) United States Patent
Son (10) Patent No.: US 8,802,498 B2
(45) Date of Patent: Aug. 12, 2014

(54) METHOD OF MANUFACTURING SEMICONDUCTOR PACKAGE HAVING NO CHIP PAD

(71) Applicant: STS Semiconductor & Telecommunications Co., Ltd., Chungcheongnam-do (KR)

(72) Inventor: Jong Myoung Son, Chungcheongnam-do (KR)

(73) Assignee: STS Semiconductor & Telecommunications Co., Ltd., Chungcheongnam-do (KR)

( * ) Notice: Subject to any disclaimer, the term of this patent is extended or adjusted under 35 U.S.C. 154(b) by 0 days.

(21) Appl. No.: 13/846,526

(22) Filed: Mar. 18, 2013

(65) Prior Publication Data

US 2013/0316496 A1    Nov. 28, 2013

(30) Foreign Application Priority Data

May 24, 2012 (KR) ........................ 10-2012-0055530

(51) Int. Cl.
| | | |
|---|---|---|
| *H01L 21/00* | (2006.01) | |
| *H01L 23/06* | (2006.01) | |
| *H01L 23/48* | (2006.01) | |
| *H01L 23/52* | (2006.01) | |
| *H01L 23/28* | (2006.01) | |
| *H01L 23/495* | (2006.01) | |
| *H01L 21/56* | (2006.01) | |
| *H01L 23/00* | (2006.01) | |
| *H01L 23/31* | (2006.01) | |

(52) U.S. Cl.
CPC ....... *H01L 24/86* (2013.01); *H01L 2924/18165* (2013.01); *H01L 23/49582* (2013.01); *H01L 2224/85439* (2013.01); *H01L 24/48* (2013.01); *H01L 2224/49171* (2013.01); *H01L 21/561* (2013.01); *H01L 2224/48247* (2013.01); *H01L 23/3107* (2013.01); *H01L 24/97* (2013.01); *H01L 24/45* (2013.01); *H01L 2224/85447* (2013.01); *H01L 21/568* (2013.01); *H01L 24/85* (2013.01); *H01L 2224/48091* (2013.01); *H01L 23/49541* (2013.01); *H01L 2224/45144* (2013.01)
USPC ........... 438/112; 438/127; 257/684; 257/690; 257/787

(58) Field of Classification Search
None
See application file for complete search history.

(56) References Cited

U.S. PATENT DOCUMENTS

| | | | | |
|---|---|---|---|---|
| 5,006,922 A | * | 4/1991 | McShane et al. | 257/697 |
| 5,844,315 A | * | 12/1998 | Melton et al. | 257/738 |
| 5,894,108 A | * | 4/1999 | Mostafazadeh et al. | 174/529 |
| 6,087,714 A | * | 7/2000 | Kubara et al. | 257/666 |
| 6,294,100 B1 | | 9/2001 | Fan et al. | |
| 7,944,039 B2 | * | 5/2011 | Arai | 257/690 |
| 2007/0128766 A1 | * | 6/2007 | Yip | 438/108 |
| 2013/0113091 A1 | * | 5/2013 | Meng et al. | 257/734 |

FOREIGN PATENT DOCUMENTS

| | | |
|---|---|---|
| JP | 10012773 A | 1/1998 |
| JP | 2004253674 A | 9/2004 |

OTHER PUBLICATIONS

Notice of Allowance corresponding to Korean Application No. 10-2012-0055530, dated Jan. 29, 2014, English translation.

* cited by examiner

*Primary Examiner* — Andres Munoz
(74) *Attorney, Agent, or Firm* — Kilpatrick Townsend & Stockton LLP (57) ABSTRACT

A method of manufacturing a semiconductor package having no chip pad includes preparing a polyimide tape on which an adhesive layer is arranged; forming lead members on the adhesive layer so as to form a plurality of semiconductor packages in a matrix form; attaching the polyimide tape to a carrier; performing wire bonding to mount semiconductor chips on the polyimide tape and connect the lead members and the semiconductor chips; forming an encapsulation member to encapsulate the semiconductor chips, the lead members, and wires; detaching the encapsulation member from the carrier and the polyimide tape; forming conductive layers each on a surface of the lead member exposed through a surface of the encapsulation member; and performing a singulation process on the encapsulation member with the conductive layers formed thereon to define unit semiconductor packages.

15 Claims, 5 Drawing Sheets

METHOD OF MANUFACTURING SEMICONDUCTOR PACKAGE HAVING NO CHIP PAD

CROSS-REFERENCE TO RELATED PATENT APPLICATION

This application claims the benefit of Korean Patent Application No. 10-2012-0055530, filed on May 24, 2012, in the Korean Intellectual Property Office, the disclosure of which is incorporated herein in its entirety by reference.

BACKGROUND OF THE INVENTION

1. Field of the Invention

Aspects of the present invention relate to methods of manufacturing semiconductor packages, and more particularly, to methods of manufacturing semiconductor packages including lead members formed using a simple process without using a separate leadframe and not including a chip pad on which a semiconductor chip is to be mounted.

2. Description of the Related Art

Recently, there is a rapidly increasing demand for portable electronic products, such as mobile phones, MP3 players, and notebook computers. In line with the demand, semiconductor packages also tend to be thinned, miniaturized, and multi-functionalized.

To satisfy such a demand for semiconductor packages, uses of semiconductor packages having small thickness and size, such as chip scale packages (CSPs) and quad flat no-leads (QFNs), have significantly increased. In addition, to satisfy the multi-functionalization of semiconductor packages, various approaches, such as installation of high-density input/output (I/O) terminals inside the semiconductor packages, have been taken.

SUMMARY OF THE INVENTION

The present invention provides a method of manufacturing a semiconductor package not including a chip pad to make the semiconductor package thin and improve heat dissipation characteristics of the semiconductor package.

According to an aspect of the present invention, there is provided a method of manufacturing a semiconductor package having no chip pad, wherein the method includes preparing a polyimide tape on which an adhesive layer is arranged; forming lead members on the adhesive layer so as to form a plurality of the semiconductor packages in a matrix form; attaching the polyimide tape to a carrier; performing wire bonding to mount semiconductor chips on the polyimide tape and connect the lead members and the semiconductor chips; forming an encapsulation member to encapsulate the semiconductor chips, the lead members, and wires; detaching the encapsulation member from the carrier and the polyimide tape; forming conductive layers each on a surface of the lead member exposed through a surface of the encapsulation member; and performing a singulation process on the encapsulation member with the conductive layers formed thereon to define unit semiconductor packages.

According to an embodiment of the present invention, the forming of the lead members includes attaching a copper layer on the adhesive layer on the polyimide tape; and etching the copper layer to form a plurality of leads.

The forming of the lead members is performed such that a plurality of leads are formed using silver (Ag) by screen printing.

According to an experimental example, the semiconductor chips are attached to the adhesive layer arranged on the polyimide tape.

The conductive layers are formed by electroplating, and the method further includes, after the etching of the copper layers to form a plurality of leads, forming a surface treatment layer on a surface of each lead member formed of copper of the copper layer, and in this regard, the surface treatment layer is a single layer formed of Ag or a layer of an Ag alloy A lead of each lead member is arranged along edges of each semiconductor chip, and the forming of the conductive layers is performed by electroless plating.

According to an embodiment of the present invention, the performing of the singulation process is performed using one method selected from cutting using a punch and cutting using a blade.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Reference will now be made in detail to example embodiments, examples of which are illustrated in the accompanying drawings. However, example embodiments are not limited to the embodiments illustrated hereinafter, and various changes in form and details may be made herein. Rather, these embodiments are provided so that this disclosure will be thorough and complete, and will fully convey the scope of the invention to those skilled in the art. In addition, the size of each element in the drawings can be exaggerated for convenience of explanation.

It will be understood that when an element is referred to as being "on" another element or "connected" to another element, it can be directly on the other element or directly connected to the other element or intervening elements may also be present. In contrast, when an element is referred to as being "directly on" or "directly connected to" another element, there are no intervening elements present. The same may be applied to the terms used to explain a relationship between elements, for example, "between" and "directly between."

Although terms, such as 'first' and 'second', can be used to describe various elements, the elements cannot be limited by the terms. The terms can be used to classify a certain element from another element. For example, a first element can be named a second element without leaving from the right scope of the inventive concept, and likely the second element can be named the first element.

An expression in the singular includes an expression in the plural unless they are clearly different from each other in a context. In the application, it should be understood that terms, such as 'include' and 'have', are used to indicate the existence of implemented feature, number, step, operation, element, part, or a combination of them without excluding in advance the possibility of existence or addition of one or more other features, numbers, steps, operations, elements, parts, or combinations of them.

All terms used herein including technical or scientific terms have the same meaning as those generally understood by those of ordinary skill in the art unless they are defined differently. It should be understood that terms generally used, which are defined in a dictionary, have the same meaning as in a context of related technology, and the terms are not understood as ideal or excessively formal meaning unless they are clearly defined in the application.

Hereinafter, exemplary embodiments of the present invention will be described in detail with reference to the accompanying drawings. Throughout the drawings, like reference numerals refer to like elements.

Figure 1:
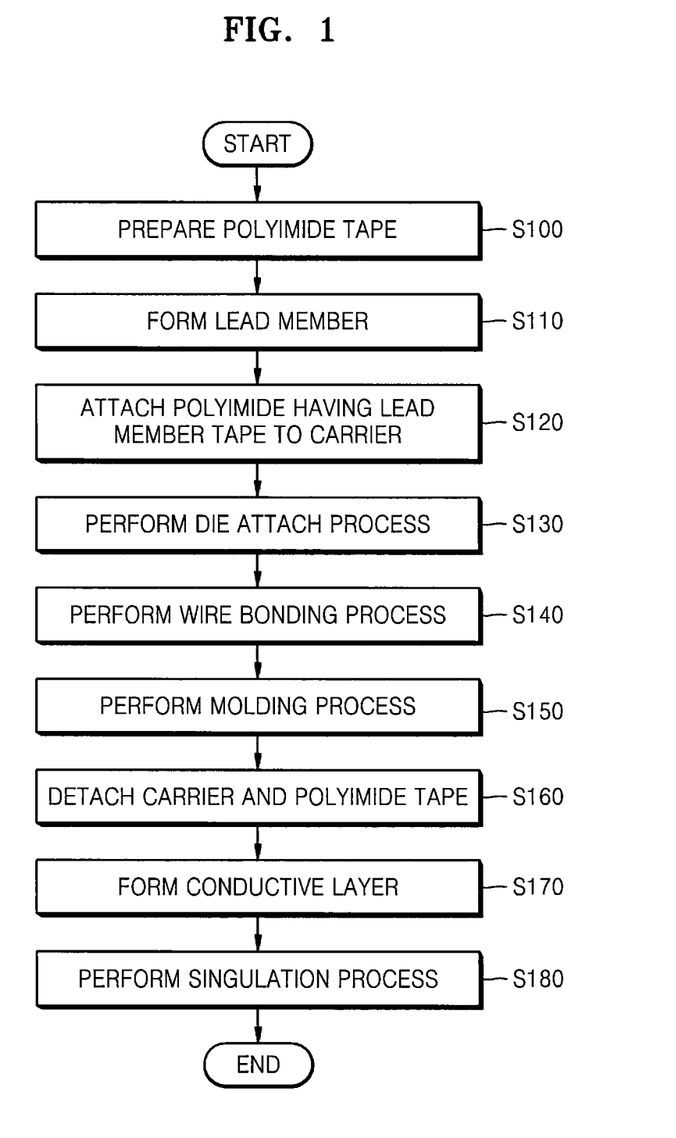
FIG. 1 is a flowchart for explaining a method of manufacturing a semiconductor package not including a chip pad, according to an embodiment of the present invention.
Figure 2A:
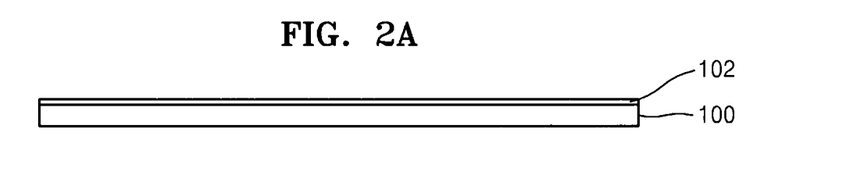
FIGS. 2A and 2B illustrates a cross-sectional view and a plan view of a polyimide tape, respectively, used to manufacture a semiconductor package, according to an embodiment of the present invention.
Figure 2B:
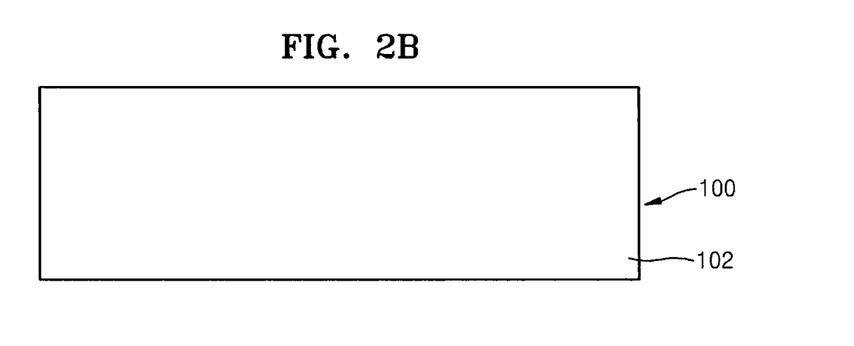

FIG. 1 is a flowchart for explaining a method of manufacturing a semiconductor package not including a chip pad, according to an embodiment of the present invention. FIGS. 2A and 2B illustrates a cross-sectional view and a plan view of a polyimide tape 100, respectively, used to manufacture the semiconductor package of FIG. 1. FIGS. 3 through 12 are plan views for illustrating a method of manufacturing the semiconductor package of FIG. 1.

Figure 3:
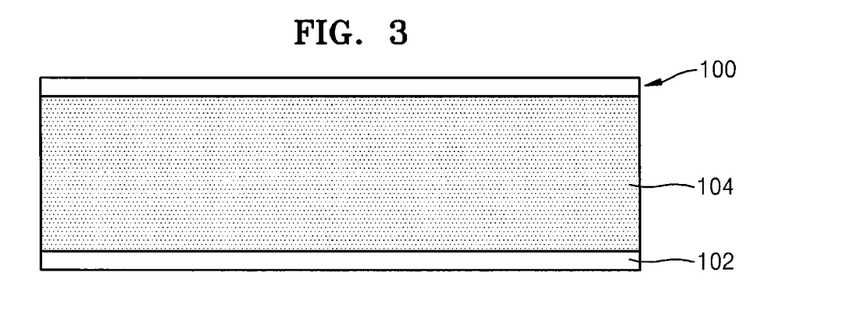
FIGS. 3 through 12 are plan views sequentially illustrating a method of manufacturing a semiconductor package not including a chip pad, according to an embodiment of the present invention.
Figure 4:
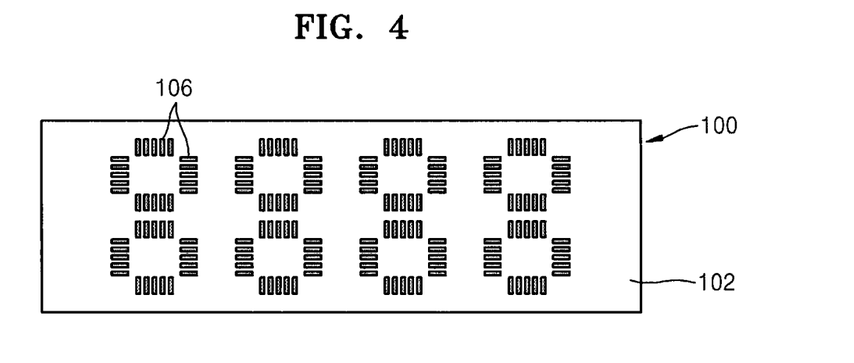
Figure 5:
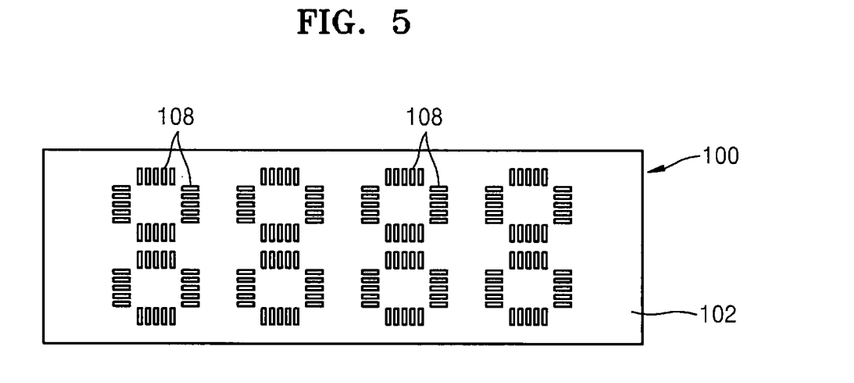

First, a polyimide tape with an adhesive layer formed thereon as illustrated in FIGS. 2A and 2B is prepared (operation S100). Subsequently, lead members are formed on the adhesive layer on the polyimide tape, as illustrated in FIGS. 3 through 5 (operation S110). Lead members refer to a portion consisting of only pure leads and not including a chip pad on which a semiconductor chip is to be mounted. The lead members may be formed by etching or screen printing. Lead members comprise a plurality of leads.

Figure 6:
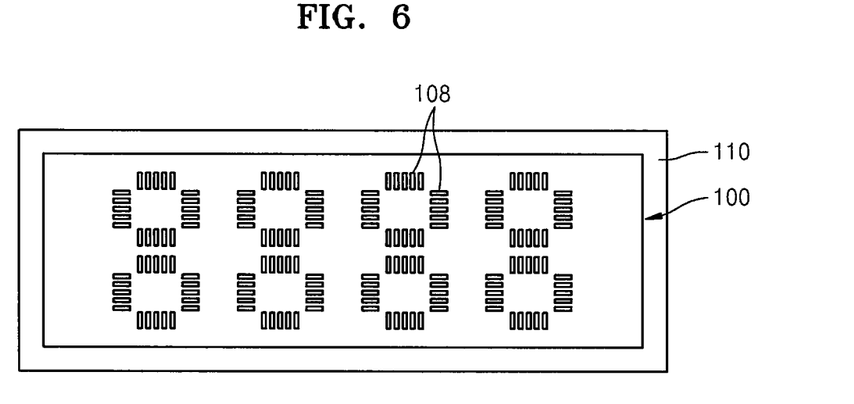

The polyimide tape on which the lead members are formed is attached to a carrier, as illustrated in FIG. 6 (operation S120). In this regard, the carrier is a rigid-type flat plate that fixes the polyimide tape for processing and facilitates transfer of the resultant structure between manufacturing processes.

Figure 7:
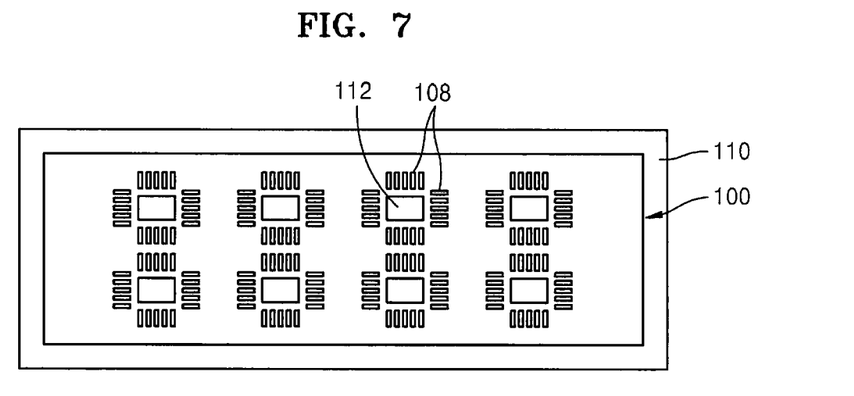
Figure 8:
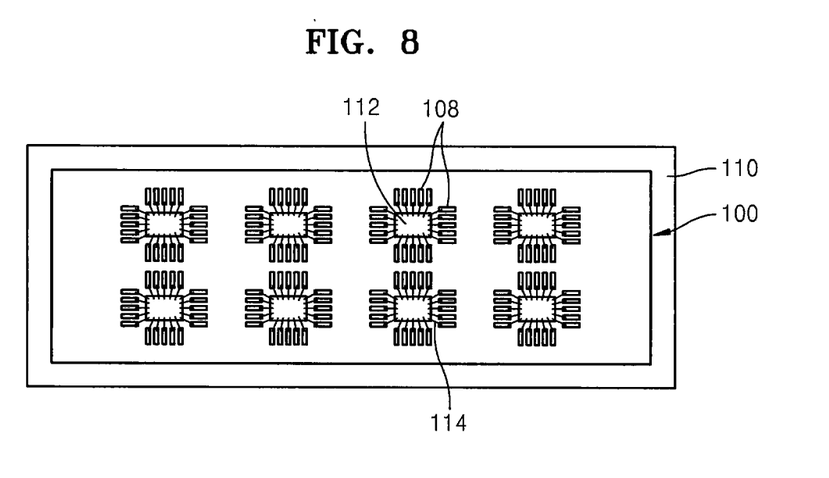
Figure 9:
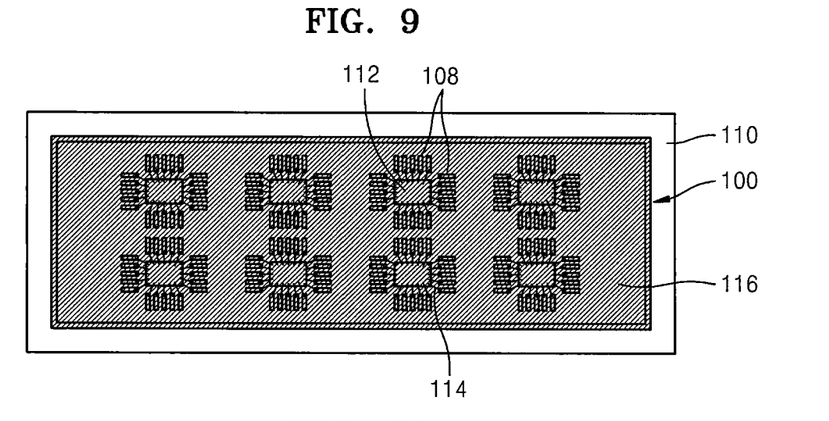

Next, the carrier is subjected to a die-attaching process (operation S130) to mount a semiconductor chip on a center of each lead member, as illustrated in FIG. 7. Subsequently, the carrier is subjected to wire bonding (operation S140) to connect the semiconductor chip and the lead members by using wires, as illustrated in FIG. 8. Afterwards, the carrier is subjected to a molding process (operation S150) to encapsulate the lead members on the polyimide tape, the semiconductor chip, and the wires by using an encapsulation member, as illustrated in FIG. 9.

Figure 10:
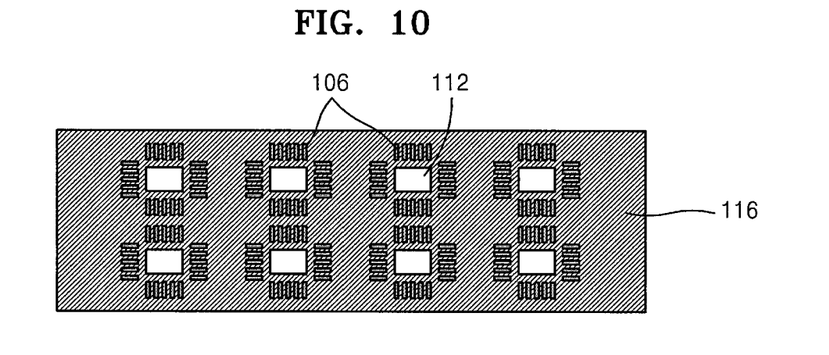
Figure 11:
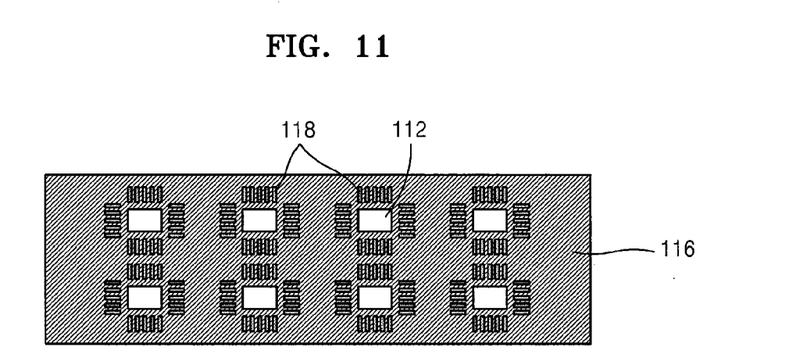

Subsequently, the carrier and the polyimide tape are detached from the encapsulation member, as illustrated in FIG. 10 (operation S160). A conductive layer is formed on bottom surfaces of the lead members that are exposed to the outside of the encapsulation member due to the detachment of the polyimide tape, as illustrated in FIG. 11 (operation S170). Then, a singulation process for cutting the encapsulation member is performed (operation S180), thereby completing the manufacture of a unit semiconductor package.

FIGS. 2A and 2B illustrates a cross-sectional view and a plan view of a polyimide tape 100, respectively, used to manufacture a semiconductor package, according to an embodiment of the present invention.

Referring to FIG. 2, the polyimide tape 100 for manufacturing a lead member used instead of a leadframe is prepared. The polyimide tape 100 is a base material used to manufacture the lead member, and any other materials having a good durability like the polyimide tape 100 and that are suitable to form an adhesive layer 102 may be used as the polyimide tape 100. Subsequently, the adhesive layer 102 is formed on the polyimide tape 100 to a small thickness. A material for forming the adhesive layer 102 may be a material of which an adhesive strength is changed by light or temperature, and the adhesive layer 102 may be formed only on regions where the lead member is to be formed and a semiconductor chip is to be mounted in subsequent processes.

FIGS. 3 through 12 are plan views sequentially illustrating a method of manufacturing a semiconductor package not including a chip pad, according to an embodiment of the present invention. FIGS. 3 through 9, and FIG. 10 through are top plan views and bottom plan views, respectively.

Lead members 106 may be formed by etching process or screen printing. Particularly, the formation of the lead members 106 by the etching process will be described with reference to FIGS. 3 through 5.

As illustrated in FIG. 3, a copper (Cu) layer 104 is formed on the adhesive layer 102. The copper layer 104 may be formed by lamination or any other method. Subsequently, as illustrated in FIG. 4, the copper layer 104 is etched to form the lead members 106 in a matrix form so as to form a plurality of semiconductor packages. The etching process may be dry etching or wet etching. Lead members 106 comprise a plurality of leads.

Next, as illustrated in FIG. 5, a surface treatment layer 108 is formed on a surface of each lead member 106. The surface treatment layer 108 is formed to address a problem in which wires made of gold (Au) are not smoothly bonded on a surface of Cu and may be formed of silver (Ag) or an Ag alloy. The surface treatment layer 108 may be not formed, if necessary.

Figure 13:
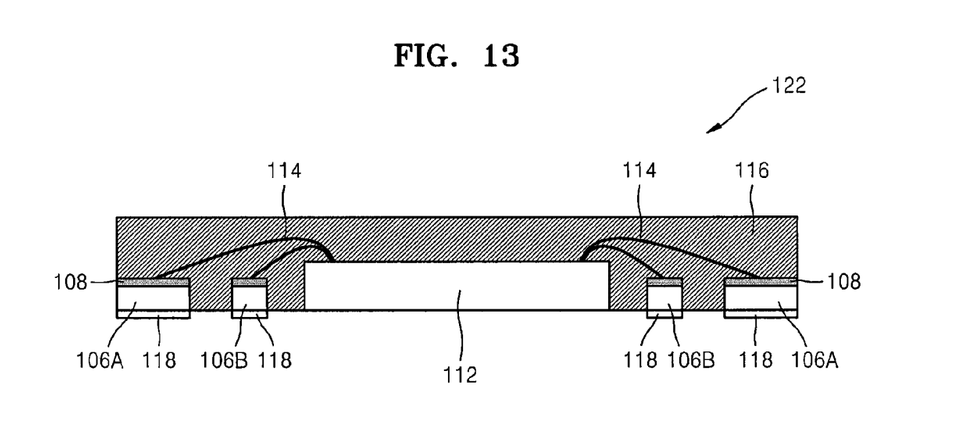
FIG. 13 is a cross-sectional view of a semiconductor package not including a chip pad, which is manufactured using the method of preparing a semiconductor package, according to an embodiment of the present invention.

In FIG. 5, one lead is illustrated in each lead member 106 on which the surface treatment layer 108 is formed, but, as illustrated in FIG. 13, at least one lead member, e.g., lead members 106A and 106B may be formed. In other words, the lead of each lead member 106 may include at least one wire connection terminal, e.g., wire connection terminals 106A and 106B on a line perpendicular to the semiconductor chip in subsequent processes. Accordingly, the lead member 106 may include more connection terminals.

Instead of using the etching process using the Cu layer, an Ag epoxy is directly screen printed on the adhesive layer 102 on the polyimide tape 100 and the resultant structure is then heated to form the lead members 106.

Referring to FIGS. 6 through 12, the polyimide tape 100 with the lead members formed thereon is mounted on a carrier 110. The carrier 110 is an auxiliary means used only for proceeding manufacturing processes and may be a hard plate. In addition, the polyimide tape 100 may be mounted on the carrier 110 by using an adhesive agent or other detachable members. Subsequently, the carrier 110 is subjected to a die-attaching process so that a semiconductor chip 112 is mounted on a center of the lead member 106 on which the surface treatment layer 108 is formed, as illustrated in FIG. 7. In this regard, a separate adhesive member is not formed below the semiconductor chip 112, and the adhesive layer 102 (see FIG. 2) formed on the polyimide tape 100 is suitable to mount the semiconductor chip 112 on the lead member 106.

Subsequently, the carrier 110 on which the polyimide tape 100 is mounted is subjected to wire bonding so as to electrically connect a bond pad of the semiconductor chip 112 and the lead member 106 with the surface treatment layer 108 formed thereon through wires 114, as illustrated in FIG. 8. The wires 114 may be Au wires. In this regard, the surface treatment layer 108 may be formed of Ag or an Ag alloy, and thus, smooth wire bonding may be performed.

Next, the carrier 110 on which the wire bonding process has been performed is subjected to a molding process so as to encapsulate the semiconductor chip 112, the wires 114, and the lead members 106, which are formed on the polyimide tape 100, by using an encapsulation member 116. The molding process may be performed using, for example, a transfer mold, and the encapsulation member 116 may be an epoxy mold compound (EMC). In one embodiment, the molding process may be modified within a range to which those skilled in the art can create.

After the molding process is completed, the carrier 110 is first detached from the resultant structure, and the adhesive strength of the adhesive layer 102 is changed so as to detach the polyimide tape 100 from the encapsulation member 116. As a result, as illustrated in FIG. 10, the resultant structure encapsulated by the encapsulation member 116 remains. In this regard, the lead members 106 formed of Cu and bottom surfaces of the semiconductor chips 112 are exposed to the outside through a bottom surface of the encapsulation member 116. Afterwards, as illustrated in FIG. 11, the resultant structure of FIG. 10 is subjected to electroless plating to selectively form conductive layers 118 only on bottom surfaces of the lead members 106. The conductive layers 118 may be formed of, for example, a tin (Sn)-lead (Pb) alloy.

Figure 12:
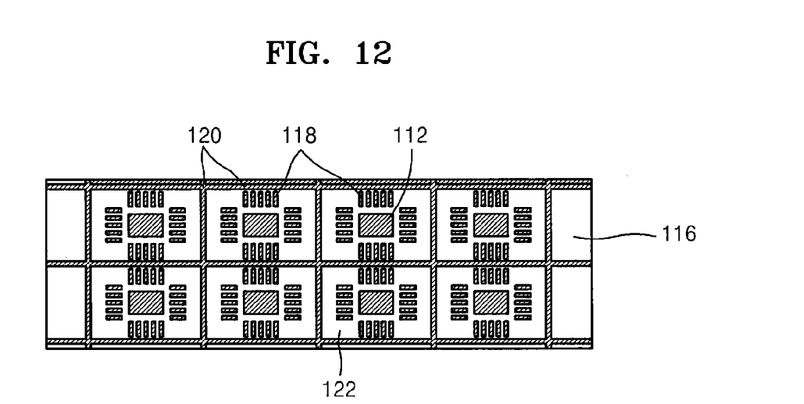

Lastly, the resultant structure of FIG. 11, including the conductive layers 118, is subjected to a singulation process so as to define unit semiconductor packages 122. The singulation process may be performed by cutting using a punch or by cutting using a blade. In FIGS. 12, reference numeral 120 denotes a cutting line along which the blade cuts in the singulation process.

FIG. 13 is a cross-sectional view of a semiconductor package 122 not including a chip pad, which is manufactured using the method of preparing a semiconductor package, according to an embodiment of the present invention.

Referring to FIG. 13, in the semiconductor package 122 according to the present embodiment, the surface treatment layer 108 and the conductive layer 118 are respectively formed on top and bottom surfaces of each of lead members 106A and 106B. The semiconductor chip 112 is disposed at a center of the lead members 106A and 106B. In this regard, a separate mounting area is not formed below the semiconductor chip 112. Thus, the semiconductor package 122 has a structure in which when a large amount of heat is generated in the semiconductor chip 112 during operation, the heat is efficiently dissipated to the outside. In FIG. 13, the two lead members 106A and 106B are illustrated. However, one or three lead members may be formed. The lead members 106A and 106B and the semiconductor chip 112 are electrically connected to each other through wires 114, and the lead members 106A and 106B, the semiconductor chip 112, and the wires 114 are encapsulated by the encapsulation member 116. Therefore, a semiconductor package having no chip pad may be manufactured.

As described above, according to the one or more embodiments of the present invention, a semiconductor package having no chip pad may be manufactured by forming only lead members on a polyimide tape by screen printing or etching, and thus, costs for purchasing a leadframe and costs spent in a die-attaching process may be reduced. In addition, since the semiconductor package does not include a chip pad, a bottom surface of a semiconductor chip is exposed to the outside. Therefore, heat dissipation characteristics of the semiconductor package may be improved and reliability defects, such as delamination defects that may occur between the semiconductor chip and the chip pad, may be suppressed. Moreover, since the semiconductor package has no chip pad, the thickness of the semiconductor package becomes small in correspondence to the thickness of the chip pad, and thus, an overall thickness of the semiconductor package may be small.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor package having no chip pad, the method comprising:
   preparing a polyimide tape on which an adhesive layer is arranged;
   forming lead members on the adhesive layer so as to form a plurality of semiconductor packages in a matrix form;
   attaching the polyimide tape to a carrier;
   performing wire bonding to mount semiconductor chips on the polyimide tape and connect the lead members and the semiconductor chips;
   forming an encapsulation member to encapsulate the semiconductor chips, the lead members, and wires;
   detaching the encapsulation member from the carrier and the polyimide tape;
   forming conductive layers each on a surface of the lead members exposed through a surface of the encapsulation member; and
   performing a singulation process on the encapsulation member with the conductive layers formed thereon to define unit semiconductor packages,
   wherein the forming of the lead members comprises attaching a copper layer on the adhesive layer on the polyimide tape and etching the copper layer to form a plurality of leads.

2. The method of claim 1, wherein the semiconductor chips are attached to the adhesive layer arranged on the polyimide tape.

3. The method of claim 1, wherein the conductive layers are formed by electroplating.

4. The method of claim 1, further comprising, after the etching of the copper layer to form the plurality of leads, forming a surface treatment layer on a surface of each lead member formed of copper of the copper layer.

5. The method of claim 4, wherein the surface treatment layer is a single layer formed of Ag or a layer of an Ag alloy.

6. The method of claim 1, wherein a lead of each lead member is arranged along edges of each semiconductor chip.

7. The method of claim 1, wherein the forming of the conductive layers is performed by electroless plating.

8. The method of claim 1, wherein the performing of the singulation process is performed using one method selected from cutting using a punch and cutting using a blade.

9. A method of manufacturing a semiconductor package having no chip pad, the method comprising:
   preparing a polyimide tape on which an adhesive layer is arranged;
   forming lead members on the adhesive layer so as to form a plurality of semiconductor packages in a matrix form;
   attaching the polyimide tape to a carrier;

performing wire bonding to mount semiconductor chips on the polyimide tape and connect the lead members and the semiconductor chips;

forming an encapsulation member to encapsulate the semiconductor chips, the lead members, and wires;

detaching the encapsulation member from the carrier and the polyimide tape;

forming conductive layers each on a surface of the lead members exposed through a surface of the encapsulation member; and performing a singulation process on the encapsulation member with the conductive layers formed thereon to define unit semiconductor packages, wherein the forming of the lead members is performed such that a plurality of leads are formed on the adhesive layer using silver (Ag) by screen printing.

10. The method of claim 9, wherein the semiconductor chips are attached to the adhesive layer arranged on the polyimide tape.

11. The method of claim 9, wherein the conductive layers are formed by electroplating.

12. The method of claim 9, forming of the lead members comprises printing an Ag epoxy layer on the adhesive layer and heating the Ag epoxy layer.

13. The method of claim 9, wherein a lead of each lead member is arranged along edges of each semiconductor chip.

14. The method of claim 9, wherein the forming of the conductive layers is performed by electroless plating.

15. The method of claim 9, wherein the performing of the singulation process is performed using one method selected from cutting using a punch and cutting using a blade.

* * * * *